(12) United States Patent
Sawada et al.

(10) Patent No.: US 6,294,133 B1
(45) Date of Patent: Sep. 25, 2001

(54) MULTIPLE DETECTING APPARATUS FOR PHYSICAL PHENOMENON AND/OR CHEMICAL PHENOMENON

(75) Inventors: Kazuaki Sawada, Hamamatsu; Katsuhiko Tomita, Kyoto; Tsuyoshi Nakanishi, Kyoto; Hiroki Tanabe, Kyoto; Susumu Mimura, Kyoto; Toshihiko Uno, Kyoto, all of (JP)

(73) Assignee: Horiba, Ltd., Kyoto (JP)

( * ) Notice: Subject to any disclaimer, the term of this patent is extended or adjusted under 35 U.S.C. 154(b) by 0 days.

(21) Appl. No.: 09/228,185

(22) Filed: Jan. 12, 1999

(30) Foreign Application Priority Data

Jan. 14, 1998 (JP) .................................................. 10-017821

(51) Int. Cl.[7] .................................................. G01N 27/00
(52) U.S. Cl. .................. 422/82.01; 422/68.1; 422/82.02; 422/82.03; 422/83; 422/98; 204/400; 204/412; 204/415; 204/416; 204/431; 204/433
(58) Field of Search .................................... 204/400, 403, 204/408, 411, 412, 415, 416, 431, 433; 422/82.01, 82.02, 82.03, 83, 98

(56) References Cited

U.S. PATENT DOCUMENTS

| | | | |
|---|---|---|---|
| 4,608,865 | * | 9/1986 | Muller et al. ........................ 73/204 |
| 4,668,374 | * | 5/1987 | Bhagat et al. ........................ 204/412 |
| 4,961,833 | * | 10/1990 | Sakai et al. .......................... 204/403 |
| 5,078,855 | * | 1/1992 | Mochizuki et al. .................. 204/418 |
| 5,209,119 | * | 5/1993 | Polla et al. ............................. 73/723 |
| 5,500,188 | | 3/1996 | Hafeman et al. . |
| 5,536,963 | * | 7/1996 | Polla ..................................... 257/417 |
| 5,798,556 | * | 8/1998 | Hughes et al. ....................... 257/414 |
| 5,877,425 | * | 3/1999 | Suzuki et al. .......................... 73/727 |
| 5,918,110 | * | 6/1999 | Abraham-Fuchs et al. ........... 438/48 |

* cited by examiner

*Primary Examiner*—Jill Warden
*Assistant Examiner*—Dwayne K Handy
(74) *Attorney, Agent, or Firm*—Price and Gess

(57) ABSTRACT

A detector assembly for detecting a plurality of different properties at the same location at the same time is provided by integrating onto a single semiconductor substrate a first detector unit for measuring a first property and a second detector unit for measuring a second property. The first and second detector units can share, for example, a common element, such as a sensor device that can provide electrical output signals representative of, respectively, the first property and the second property. The common element can include a diaphragm with a pyroelectric element to provide a measurement of temperature and pressure.

26 Claims, 11 Drawing Sheets

Fig. 7
(A) SW₃₆ 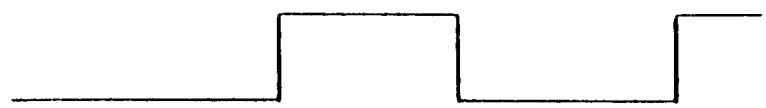
(B) V_read 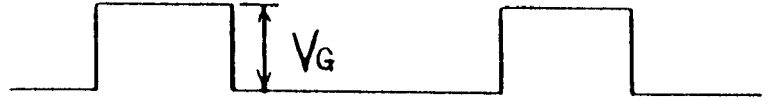
(C) V_out 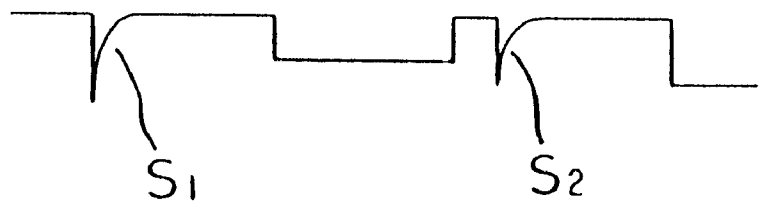

Fig. 9
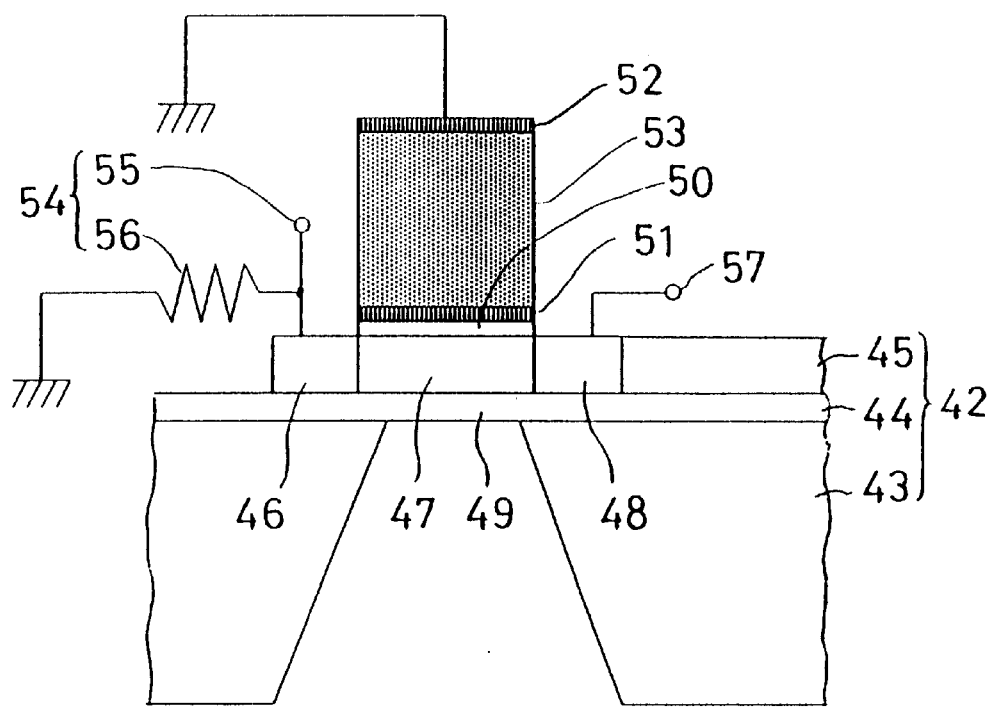
Fig. 10
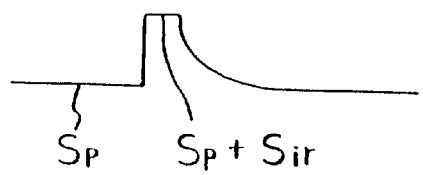

Fig. 12
(A) Infrared ray shutter 
(B) $V_g$ 
(C) $V_{out}$ A 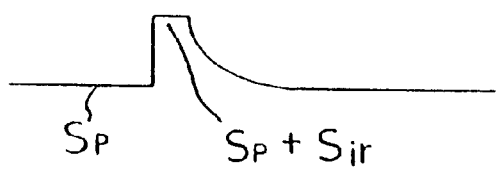
(D) $V_{out}$ B 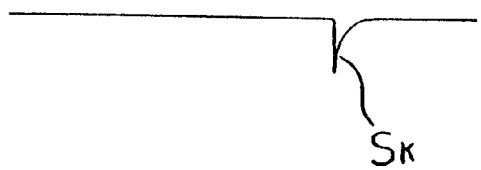

MULTIPLE DETECTING APPARATUS FOR PHYSICAL PHENOMENON AND/OR CHEMICAL PHENOMENON

BACKGROUND OF THE INVENTION

1. Field of the Invention

The present invention relates to a detecting apparatus for physical phenomenon and/or chemical phenomenon, and more particularly to a detecting apparatus of physical phenomenon and/or chemical phenomenon capable of detecting plural physical phenomena and/or chemical phenomena almost simultaneously on the same substrate. The physical phenomena and chemical phenomena can include temperature, light in a wider sense of meaning (visible light, ultraviolet ray, infrared ray, X-ray, electromagnetic wave, etc.), ion concentration, magnetism, pressure, acceleration, speed, sound wave, ultrasonic wave, oxidation-reduction potential, rate of reaction, and other various phenomena.

2. Description of Related Art

These physical phenomena or chemical phenomena were hitherto observed individually by using individual detector elements, such as a temperature sensor, photo sensor, physical characteristics sensor, and chemical sensor, which converted the detected measurements into various electric signals (current, voltage, resistance, capacity, potential).

For example, in the case of a pyroelectric sensor known as a typical thermal sensor, when the temperature changes, an electric charge is generated in the pyroelectric element, and its potential change is amplified by an FET (field effect transistor), and subsequently read. In the case of a photo diode known as a representative photo sensor, the electric charge generated by light is taken out as an electric current. In the case of a pressure sensor utilizing the piezo-resistance effect known as a representative physical sensor, the resistance change by pressure is read. In measurement of pH by using an ISFET (ion sensitive field effect transistor) known as a representative chemical sensor, as hydrogen ions are absorbed on a response membrane, the channel conductance changes, and by measuring the current flowing in the FET, the pH value of a solution is measured.

Further, imaging has been attempted by arranging these various sensors parallel in two-dimensional directions, and acquiring the output distribution simultaneously. A representative example thereof is a solid state imaging device. In this device, a plurality of photo diodes are arranged two-dimensionally, the electric charge generated in the photo diodes depending on the intensity distribution of incident light is accumulated in the internal capacity for a specific time, and the signals are gated to the outside in a time series at specific time intervals by using a charge transfer device or MOS transistor array.

However, generally in any one of these sensors and devices, signals or distributions of plural physical phenomena and/or chemical phenomena at the same time and in the same place could not be observed.

OBJECTS AND SUMMARY OF THE INVENTION

The invention is devised in light of the above background, and it is hence an object thereof to provide a detecting apparatus of physical phenomenon and/or chemical phenomenon (hereinafter called phenomenon detecting apparatus), capable of observing plural physical phenomena and/or chemical phenomena occurring at a same or almost same time, and in a same or almost same place.

To achieve the object, the phenomenon detecting apparatus of the present invention includes phenomenon detecting units for detecting physical phenomena and/or chemical phenomena for incorporating electric signals of two or more physical phenomena and/or chemical phenomena at least almost simultaneously, disposed on one side of an integral semiconductor substrate.

According to the phenomenon detecting apparatus thus constituted, electric output signals (current, voltage, charge, etc.) of plural physical phenomena and/or chemical phenomena occurring at a same or almost same time, and in a same or almost same place can be obtained, so that the mutual actions of hitherto unknown physical phenomena and/or chemical phenomena can be known and recorded. By knowing two or more physical phenomena and/or chemical phenomena simultaneously, phenomena, such as relationships between the measured properties, not found by an existing single detecting devices may be discovered.

By arranging the phenomenon detecting units one-dimensionally or two-dimensionally, a distribution of physical phenomena and/or chemical phenomena may be known. Further, since outputs of these phenomenon detecting units are electric output signals, such as current, voltage, and charge, by accumulating the outputs for a specific time, the outputs of the individual phenomenon detecting units can be taken out in time series. As a result, it is easier to incorporate the outputs into a television screen or computer, so that two-dimensional distribution of physical phenomena and/or chemical phenomena may be observed at high sensitivity and high definition.

A detector assembly for measuring individually pressure, temperature, and light can be formed on an integral semiconductor substrate. A diaphragm of an n-type monocrystalline silicon layer and an $SiO_2$ insulator layer can bridge across separate positions of a silicon base to provide a pressure sensitive structure. A plurality of transistors and a gate can be formed on the substrate and a pyroelectric element can be mounted on the diaphragm. The substrate can further be constructed to provide an integral photodiode for measuring light. The diaphragm is responsive to changes in pressure, while the pyroelectric element can measure temperature.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

FIGS. 7A–7C show a timing chart for explaining the operation of the apparatus;

FIG. 9 is a diagram showing an example of a phenomenon detecting apparatus in a fourth embodiment;

FIGS. 10A–10B show a timing chart for explaining the operation of the apparatus;

FIGS. 12A–12D show a timing chart for explaining the operation of the apparatus.

DETAILED DESCRIPTION OF THE PREFERRED EMBODIMENTS

The following description is provided to enable any person skilled in the art to make and use the invention and sets forth the best modes contemplated by the inventors/ of carrying out their invention. Various modifications, however, will remain readily apparent to those skilled in the art, since the general principles of the present invention have been defined herein specifically to provide a multiple detecting apparatus for physical phenomenon and/or chemical phenomenon.

Figure 1:
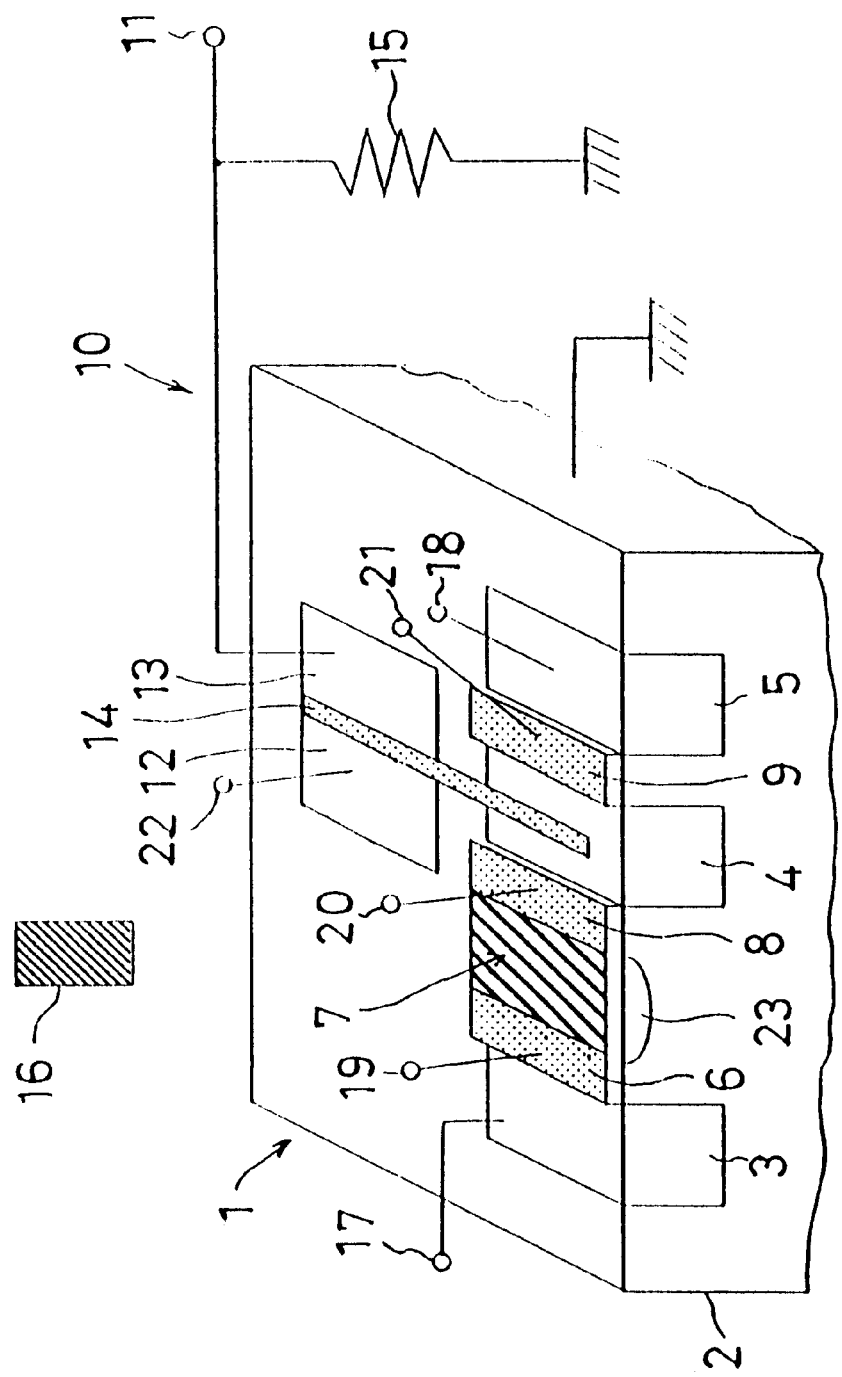
FIG. 1 is a diagram showing an example of a phenomenon detecting apparatus in a first embodiment.
Figure 2:
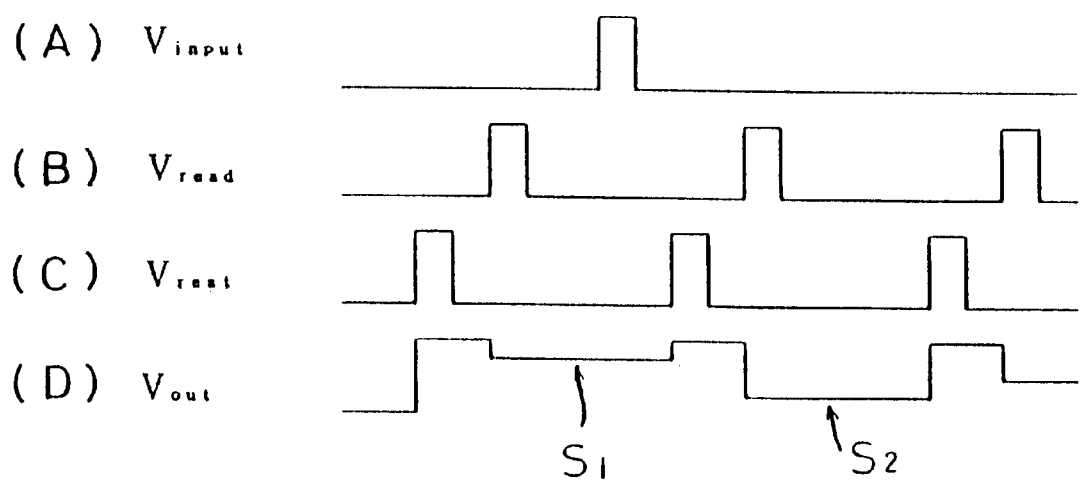
FIG. 2 is a timing chart for explaining the operation of the apparatus.

Referring now to the drawings, preferred embodiments of the invention are specifically described below. FIG. 1 and FIG. 2 show a first embodiment. The phenomenon detecting apparatus in this embodiment is capable of detecting simultaneously light intensity (physical phenomenon) and ion concentration (chemical phenomenon) in a same place or location of the detecting apparatus.

In FIG. 1, reference numeral 1 is a phenomenon detecting apparatus main body, which is composed as follows. That is, reference numeral 2 is a semiconductor substrate, for example, a p-type silicon substrate. On one side (an upper side in the illustrated example) of this silicon substrate 2, three n-type diffusion regions 3, 4, 5 are formed at properly spaced intervals. Between the diffusion regions 3 and 4, through a thin oxide film, a barrier 6, a sensing unit 7 as phenomenon detecting unit for detecting physical phenomena and/or chemical phenomena, and a read electrode 8 are formed. Between the diffusion regions 4 and 5, through a thin oxide film, a reset gate 9 is formed.

The sensing unit 7 is coated with a silicon nitride, $Si_3N_4$, film so as to be capable of sensing hydrogen ions. This sensing unit 7 is composed to detect also light intensity and, therefore, may be also called a pH sensing unit (detector of chemical phenomenon) combined with a light sensing unit (detector of physical phenomenon) on an integral substrate with a common detecting element as a sensor.

The diffusion region 3 functions as an input diode and is biased at a positive potential, as a positive input voltage ($V_{input}$) (see FIG. 2(A)) is always applied. The diffusion region 4 is an electrically floating region and is composed so as to guide the ion signal charge or light signal charge obtained in the sensing unit 7 by raising the potential $V_{read}$ (see FIG. 2(B)) of the read electrode 8.

The initial potential of the diffusion region 4 is determined by the applied voltage to the diffusion region 5 and the applied voltage $V_{rest}$ (see FIG. 2C)) to the reset gate 9. The charge in the diffusion region 4 can be taken out by using a source follower circuit 10 of an MOS transistor from its output terminal 11. The source follower circuit 10 of the MOS transistor is composed of a drain region 12 and a source region 13, being n-type diffusion regions in which an adequate voltage (for example, about 5 V) is applied, and a gate electrode 14 and a resistance 15 electrically connected to the diffusion region 4.

In FIG. 1, reference numeral 16 is a reference electrode, which is connected to an adequate power source and used in a converted manner. Reference numerals 17 to 22 are terminals for applying voltage.

In the constituted phenomenon detecting apparatus, the operation is explained below, while referring to a timing chart in FIG. 2. The phenomenon detecting apparatus main body 1 is placed in a solution (not shown). In this solution, the reference electrode 16 is immersed in order to determine its potential. The silicon substrate 2 is grounded. In this state, beneath the sensing unit 7 of the silicon substrate 2, a depletion layer 23 is created, depending on the voltage applied to the reference electrode 16 and the pH concentration in the solution.

First, explaining the detection of light intensity, suppose the light is entering the upper surface of the silicon substrate 2. When the light enters the depletion layer 23, electron-hole pairs are formed, and holes are discharged outside from the silicon substrate 2, and electrons are accumulated in the depletion layer 23. The diffusion region 4 is fixed at an initial potential based on the positive voltage applied to the reset gate 9 before the electrons accumulated in the depletion layer 23 flow in. By applying a positive voltage to the read electrode 8 in a square wave, as shown in FIG. 2(A), the electrons begin to flow into the diffusion region 4, which was fixed preliminarily at a specific potential, and the potential in this diffusion region 4 is changed as a result of the measurement. By reading this potential change in the source follower circuit 10, the intensity of the light can be detected.

Next, explaining detection of pH of the solution, since the potential of the reference electrode 16 is fixed, the potential of the depletion layer 23 beneath the sensing unit 7 varies depending on the pH concentration of the solution. The input diode 3 is always biased at a positive voltage, and when this potential is lower than the potential of the barrier 6, electrons ride over the barrier 6 and flow into the depletion layer 23 beneath the sensing unit 7. When the potential of the input diode 3 is raised again higher than the potential of the barrier 6 (returning to the potential in the initial state), the electric charge depending on the pH concentration of the solution is left over beneath the sensing unit 7. Consequently, as shown in FIG. 2(B), by applying a positive voltage to the read electrode 8 in a square wave, the electrons are reset, and flow into the diffusion region 4 preliminary set at higher potential, thereby varying the potential in this diffusion region 4. By reading this potential change in the source follower circuit 10, the pH of the solution can be detected. FIG. 2(C) discloses the reset voltage signal applied to the reset gate 8.

Thus, according to the phenomenon detecting apparatus of this constitution, the light intensity and pH concentration, substantially early at the same time and in the same place with a common sensing element can be known. In this phenomenon detecting apparatus, as shown in FIG. 2(D), the voltage signal S, relating to light intensity and voltage signal $S_1$ relating to pH can be sequentially obtained from the same output terminal 11.

Figure 3:
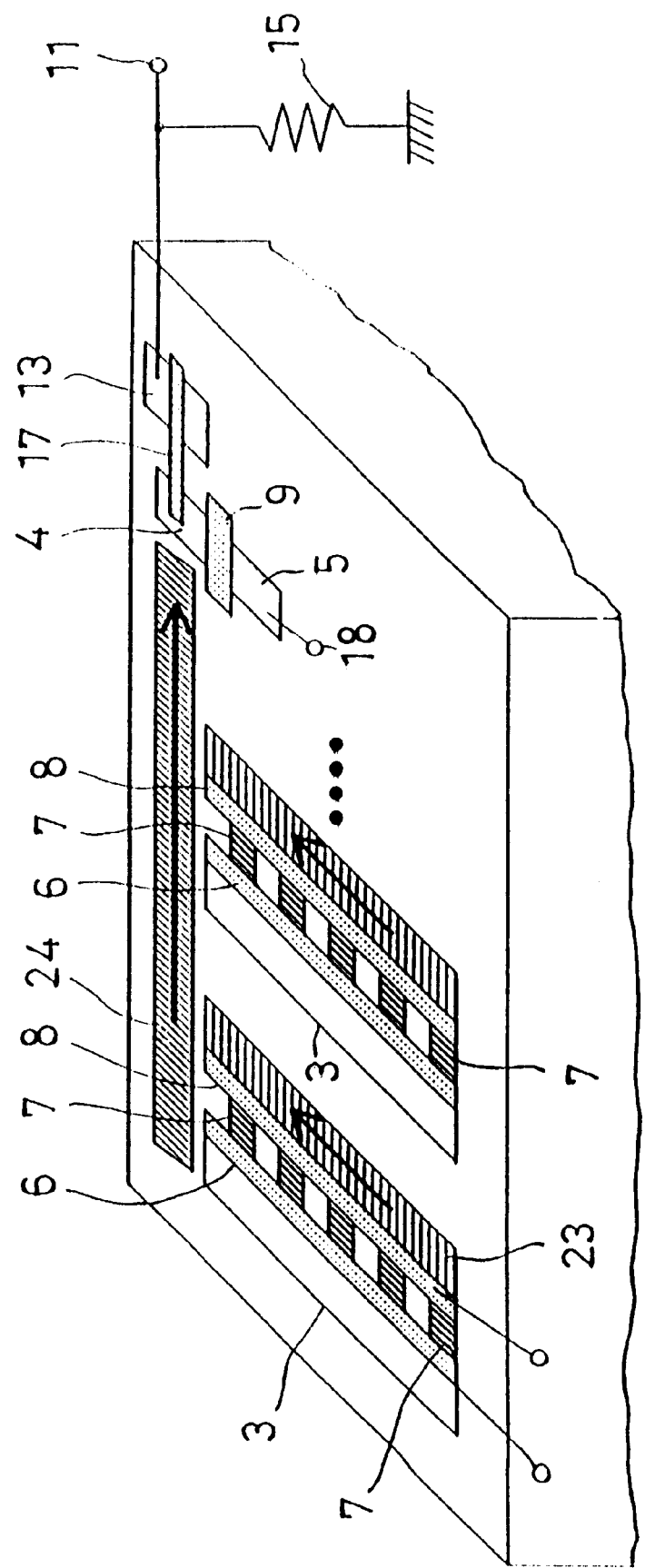
FIG. 3 is a diagram showing an application example of the apparatus.

FIG. 3 shows an application example of the phenomenon detecting apparatus, and in the constitution shown in FIG. 3, a plurality of sensing units 7 are arranged in lines and rows two-dimensionally, in which the electric charge flowing in the read electrode 8 is transferred by a CCD (charge coupled device) or the like, and is read out at the output terminal 11 by the source follower circuit 10 so that the two-dimensional information can be taken out in a time series for further processing. In FIG. 3, reference numeral 23 is a horizontal CCD, and 24 is a vertical CCD. A computer circuit can monitor and provide timing signals for the accumulation and discharge of the phenomenon detected signals.

Although not shown, a plurality of sensing units 7 may also be arranged one-dimensionally.

Figure 4:
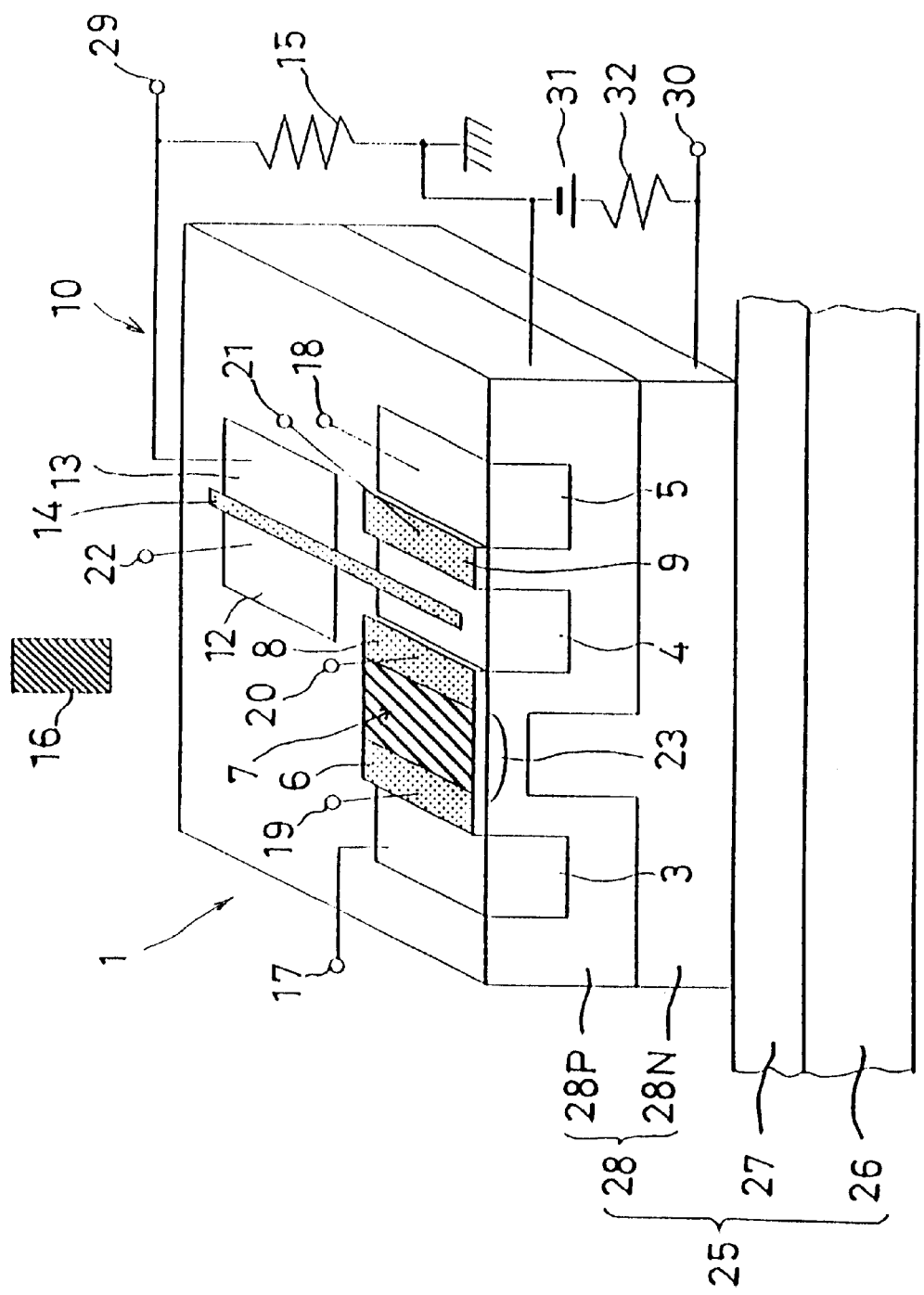
FIG. 4 is a diagram showing an example of a phenomenon detecting apparatus in a second embodiment.
Figure 5:
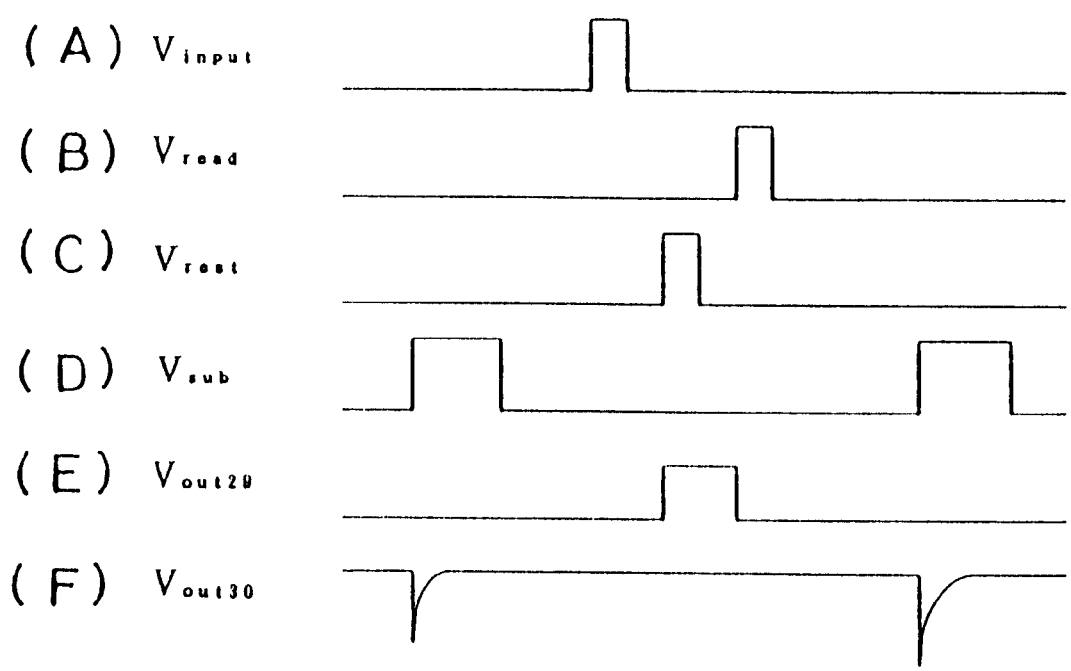
FIGS. 5A–5F show a timing chart for explaining the operation of the apparatus.

FIG. 4 and FIG. 5 relate to a second embodiment of the present invention. The phenomenon detecting apparatus according to this embodiment can detect the light intensity (physical phenomenon) and ion concentration (chemical phenomenon) in the same position at the same time.

In the phenomenon detecting apparatus of the second embodiment, instead of the silicon substrate 2, an SOI (silicon on insulator) substrate is used as a semiconductor substrate, and a voltage signal relating to light intensity and a voltage signal relating to pH are obtained from different output terminals.

That is, in FIG. 4, reference numeral 25 is an SOI substrate, in which an $SiO_2$ layer 27 as an insulator and an n-type single crystalline silicon substrate 28 are formed on the upper surface of a silicon substrate 26. In this SOI substrate 25, a p-type region 28P is formed in the upper half of the n-type silicon substrate 28, and necessary parts including the sensing units 7, the same as in the first embodiment are formed in this p-type region 28P. Reference numeral 28N is an n-type region in the lower half of the n-type silicon substrate 28.

Further, in FIG. 4, reference numeral 29 is a signal output terminal as a constituent component of the source follower circuit 10, and a voltage signal relating to pH is issued to this terminal 29. Reference numeral 30 is a signal output terminal connected to the p-type region 28P, and a voltage signal relating to light intensity is issued to this terminal 30. Reference numeral 31 is a bias power source for applying a bias voltage in the p-type region 28P and n-type region, as shown in FIG. 4, and its cathode side is connected to the grounding side of the resistance 15 of the source follower circuit 10, and its anode side is connected to the signal output terminal 30.

The operation of the thus constituted phenomenon detecting apparatus is explained by referring to the timing chart in FIG. 5. The phenomenon detecting apparatus main body 1 and reference electrode 16 are installed in a slate such that they are immersed in a solution, not shown in the diagram.

First, explaining the detection of light intensity, when the light enters the depletion layer 23 beneath the sensing unit 7, electron-hole pairs are formed, and holes are discharged outside from the silicon substrate 2, and electrons are accumulated in the depletion layer 23. After the signals are accumulated for a specific time by increasing the bias voltage $V_{sub}$ to the substrate 28 by the bias power source 31 (see FIG. 5(D)), the electric charge in the depletion layer 23 is allowed to flow into the n-type region 28N, and a voltage signal (see FIG. 5(F)) relating to light intensity is obtained from the output terminal 30. This is because, by increasing the voltage $V_{sub}$ to the substrate 28, the barrier potential between the sensing unit 7 and the region 28P is lowered, and a potential gradient is formed.

Next, detection of pH of the solution is the same as in the first embodiment, and an output signal, as shown in FIG. 5(E) is issued from the output terminal 29. Incidentally, FIG. 5(A) shows input voltage $V_{input}$ to the input diode 3, FIG. 5(B) voltage $V_{read}$ applied to the read electrode, and FIG. 5(C) reset voltage $V_{rest}$ applied to the reset gate 9.

In the phenomenon detecting apparatus of the second embodiment, the same as in the first embodiment, a plurality of sensing units 7 may be arranged either one-dimensionally or two-dimensionally.

In these embodiments, one sensing unit 7 is designed to detect both pH and light, but it may be also designed to detect pH and light by different sensing units, which is explained below as a third embodiment.

Figure 6:
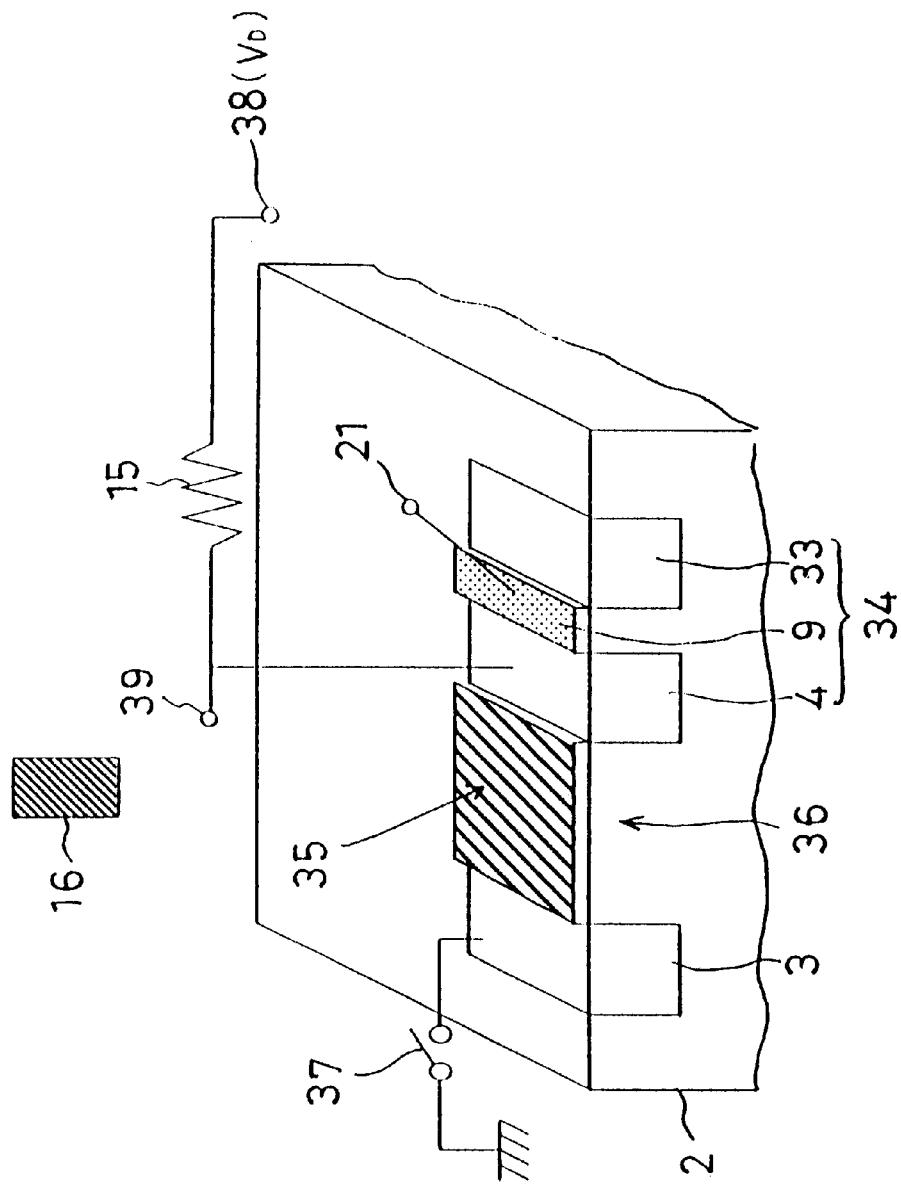
FIG. 6 is a diagram showing an example of a phenomenon detecting apparatus in a third embodiment.

FIG. 6 and FIG. 7 show the third embodiment. In FIG. 6, reference numerals 3, 4 and 33 are n-type diffusion regions formed on a p-type silicon substrate 2 at a proper interval. Herein, the diffusion region 33 has a photo diode structure, and its upper surface is a visible light sensing unit. By the diffusion regions 4, 33 and read electrode 9, a light intensity detection unit 34 is formed. The portion 35 between the diffusion regions 3 and 4 is formed as a pH sensing unit responding to pH. The constitution of the sensing unit 35 is the same as that of the sensing unit 1 in the first embodiment. By the pH sensing unit 35 and diffusion regions 3, 4, the pH detection unit 36 is formed.

Further, in FIG. 6, reference numeral 37 is a normally open switch interposed between the diffusion region 3 and grounding potential, 38 is a power source connected to a resistance 15, and 39 is a signal output terminal.

The operation of the phenomenon detecting apparatus is described below while referring to the timing chart in FIG. 7. The phenomenon detecting apparatus main body 1 and the reference electrode 16 are installed in a state that they are immersed in a solution, not shown in the diagram.

First, to detect the light intensity, a positive voltage $V_G$ (see FIG. 7(B)) equal to or larger than the threshold voltage is applied to the read electrode 9 through terminal 21, then an inverse bias voltage nearly equal to the voltage $V_D$ applied to the terminal 38 is applied to the visible ray sensing unit 33, and therefore, if the voltage of the read electrode 9 is returned to the grounding potential, the inverse bias voltage nearly equal to the voltage $V_D$ remains applied in the visible ray sensing unit 33, which is in an electrically floating state.

In this state, when the light enters the visible light sensing unit 33, electron-hole pairs are formed in the depletion layer spreading in the visible ray sensing unit 33, and electric charges are accumulated in the capacity formed by pn junction existing in the visible ray sensing unit 33, and the inverse bias voltage applied in the visible ray sensing unit 33 becomes smaller. After accumulating these charges for a specific predetermined time period, when voltage $V_G$ is applied again to the read electrode 9, the accumulated charge flows out through the resistance 15, and a voltage drop corresponding to the light signal appears at the output terminal 39 ($S_1$ in FIG. 7(C)). At this time, the voltage of the visible ray sensing unit 33 is reset in the initial state nearly equal to the voltage $V_D$ again as the current flows. Thus, the light intensity is obtained as a voltage value.

Explaining next the detection of the pH of solution, this pH detection is realized while the light signals are being accumulated. That is, while voltage $V_G$ is not applied to the read electrode 9, by turning on the switch 37, the pH signal can be read out ($S_2$ in FIG. 7(C)). That is, the conductance of the channel occurring in the interface of the silicon beneath the pH sensing unit 35 and the oxide film depends on the pH concentration in the solution, and hence the current flowing in the interface corresponds to the pH concentration. Therefore, the voltage observed at the output terminal 39 depends on the pH concentration of the solution.

In the phenomenon detecting apparatus in the third embodiment, signals of light intensity and pH concentration appear alternately at the output terminal 39, as shown in FIG. 7(C)), and they can be observed alternately. Or by stopping either the switching operation of the switch 37 or the voltage application operation to the read electrode, either the light intensity or the pH concentration only may be observed. These control functions can be instigated by a computer circuit (not shown).

Figure 8:
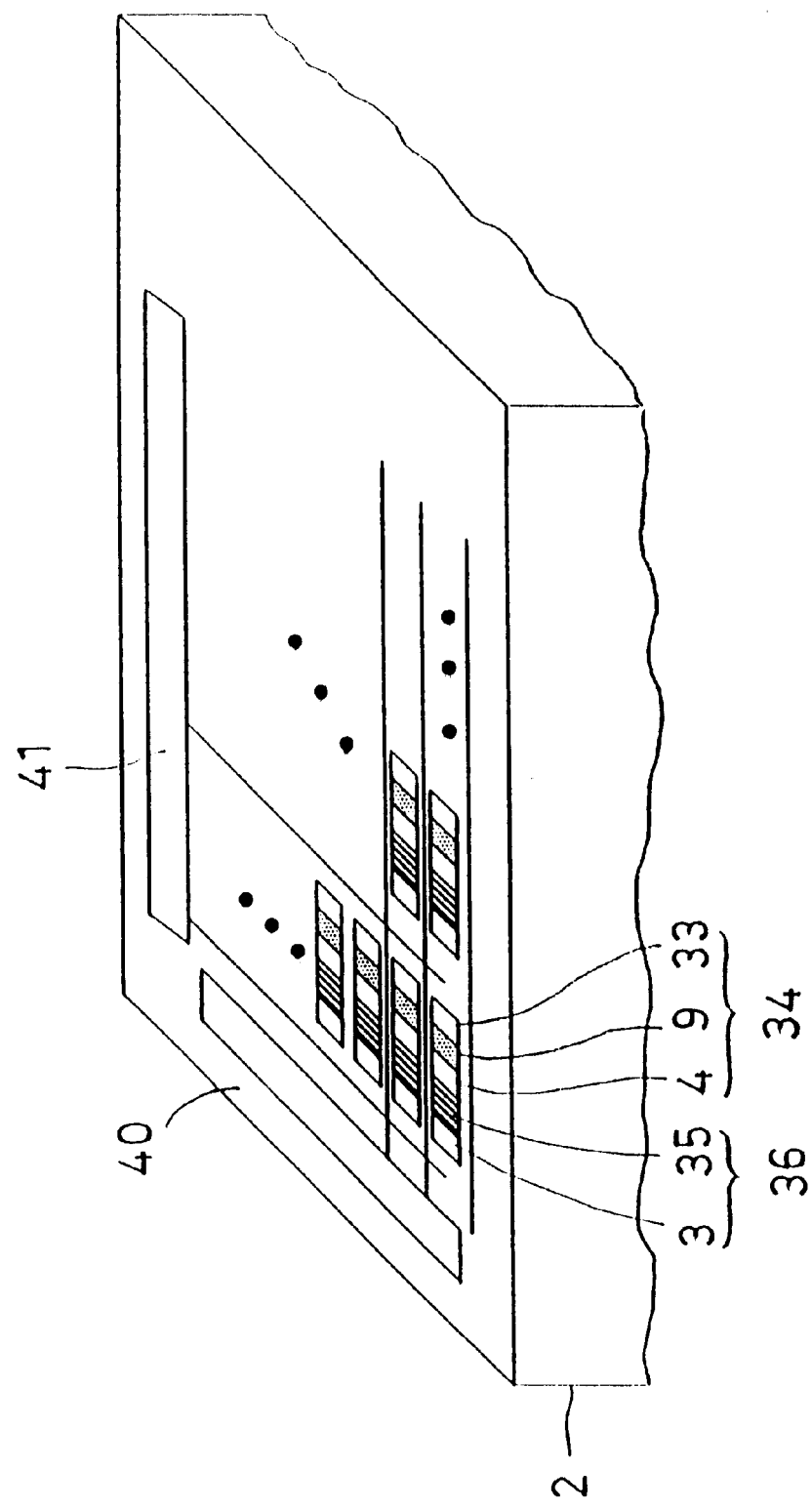
FIG. 8 is a diagram showing an application example of the apparatus.

FIG. 8 shows an application example of the phenomenon detecting apparatus in the third embodiment, and in the constitution shown in FIG. 8, a plurality of light intensity detecting units 34 and pH detecting units 36 are arranged in lines and rows two-dimensionally, and they are sequentially driven by shift registers 40, 41 so that the optical image and pH concentration distribution image in the nearly same region and at the nearly same time can be observed.

Herein, although not shown in the diagram, the plurality of the light intensity detecting units 34 and pH detecting units 36 may be also arranged one-dimensionally.

In the foregoing embodiments, the pH concentration is shown as the example of chemical phenomenon, but other ion concentrations may also be detected.

FIG. 9 and FIG. 10 relate to a fourth embodiment, and the phenomenon detecting apparatus in this embodiment is designed to detect temperature and pressure. That is, in FIG. 9, reference numeral 42 is an SOI substrate, in which an $SiO_2$ layer 44 as an insulator and an n-type monocrystalline silicon substrate 45 are formed on the upper surface of a silicon substrate 43. On the upper surface of the of the SOI substrate 42, usually n-channel transistors 46, 47, 48 are formed in a depletion type. To match with the channels of the n-channel transistors 46, 47 48, a portion of the substrate 43 is removed by etching, and a diaphragm 49 is formed as a phenomenon detecting unit. Further, on the top of a gate 50 of the n-channel transistors 46, 47, 48, a pyroelectric element 53 having upper and lower electrodes 51, 52 is provided as a phenomenon detecting unit. This pyroelectric element 53 is composed of for example, PZT, PZLT ceramics, PVDF (polyvinylidene fluoride), or the like to detect temperature.

In FIG. 9, meanwhile, reference numeral 54 is a source follower circuit, 55 is an output terminal, and 56 is a resistance. Reference numeral 57 is a voltage application terminal.

In the thus constituted phenomenon detecting apparatus, the operation is described below, while referring to the timing chart in FIG. 10. First, explaining the detection of pressure, the pressure can be detected by making use of a change of channel conductance of the n-channel transistors 46, 47, 48 depending on the pressure applied to the diaphragm 49. That is, the pyroelectric element 53 does not generate voltage in a stationary state, and the gate voltage is almost zero, and the output due to pressure can be obtained by observing the current flowing in the n-channel transistors 46, 47, 48, and this current is obtained from the source follower circuit 54. In FIG. 10, $S_P$ is a pressure signal.

As for the temperature, by chopping the heat (infrared ray) entering the pyroelectric element 53 by a chopper (not shown), a voltage corresponding to the heat is induced at the pyroelectric element 53, and the gate voltage of n-channel transistors 46, 47, 48 varies so that the current flowing in the n-channel transistors 46, 47, 48 changes. Therefore, by measuring the current before chopping and reading the difference, the temperature distribution is known. In FIG. 10, $S_P+S_{ir}$ is pressure signal+temperature signal.

According to the phenomenon detecting apparatus in this embodiment, temperature correction is possible with pressure detection, and a common element is used in both measurements that can integrally be formed on the substrate.

Moreover, by one-dimensional or two-dimensional configuration of the phenomenon detecting apparatus main bodies in the embodiment, spatial distribution of pressure and temperature can be detected.

In the foregoing embodiments, the physical phenomena and/or chemical phenomena as objects of detection were two phenomena each, but the invention is not limited to this, and three or more phenomena can be detected. A phenomenon detecting apparatus for detecting three phenomena is described below.

Figure 11:
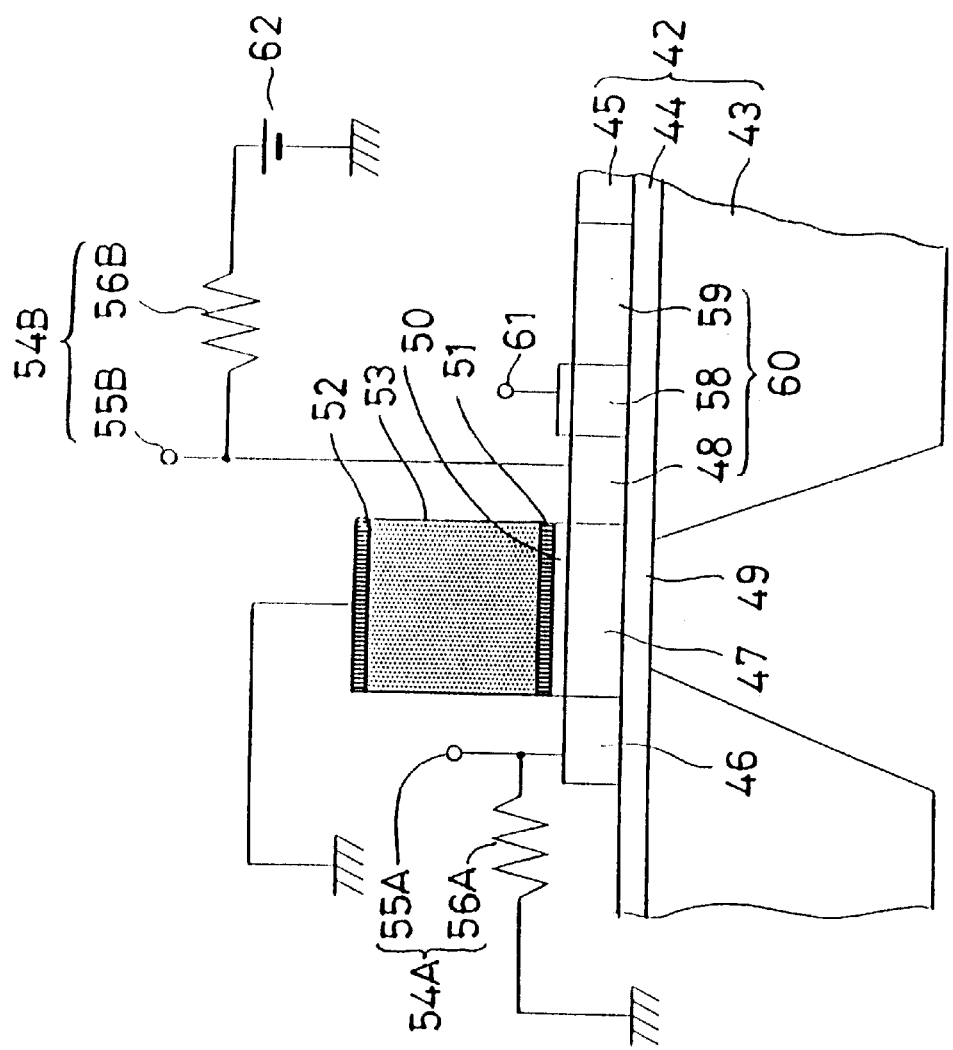
FIG. 11 is a diagram showing an example of a phenomenon detecting apparatus in a fifth embodiment.

FIG. 11 and FIG. 12 relate to a fifth embodiment, and the phenomenon detecting apparatus in this embodiment can detect three phenomena, that is, temperature, pressure, and visible light. That is, the phenomenon detecting apparatus shown in FIG. 11 has regions 58, 59 added to the embodiment shown in FIG. 9, and, in particular, the region 59 is a photo diode sensitive to a visible ray, and a visible ray detecting unit 60 composed of regions 48, 58, 59 is added. Reference numerals 54A, 55A are source-follower circuits in the same constitution as the source follower circuit 54 in the fourth embodiment, and a pressure signal and a temperature signal are issued to an output terminal 55a of one source follower circuit 54A, while a visible ray signal is issued to an output terminal 55B of other source follower circuit 54B. Reference numeral 61 is a voltage application terminal, and 62 is a power source connected to a resistance 56B of the source follower circuit 54B.

The operation of a thus constituted phenomenon detecting apparatus is described below, while referring to the timing chart in FIG. 12. First, the detection of pressure and temperature is the same as in the phenomenon detecting apparatus in the fourth embodiment, and in this embodiment, as shown in FIG. 12(C), pressure signal $S_P$, or pressure signal $S_P$+temperature signal $S_{ir}$ is issued to the output terminal 55A of the source follower circuit 54A.

As for the visible ray signal, by applying a positive voltage $V_g$ (see FIG. 12(B)) to the region 48 functioning as read electrode, it is generated by input of visible rays and the electric charge accumulated in the visible ray sensing unit 59 can be read out. Its output $S_k$ is issued to the output terminal 55B of the source follower unit 54B, as shown in FIG. 12(D).

Moreover, by one-dimensional or two-dimensional configuration of the phenomenon detecting apparatus main bodies in the embodiment, spatial distribution of pressure, temperature, and visible ray can be detected.

According to the phenomenon detecting apparatus of the present invention, electric output signals of plural physical phenomena and/or chemical phenomena occurring at a same or almost same time, in a same or almost same place can be obtained, and the mutual action of the hitherto unknown physical phenomena and/or chemical phenomena can be known. Thus, be detecting two or more physical phenomena and/or chemical phenomena simultaneously, phenomena not found by existing single detecting elements can be discovered.

By integrating such phenomenon detecting devices at a high density by employing integrated circuit technology and accumulating in time, an apparatus of high resolution and high sensitivity is obtained, and two-dimensional distribution of physical phenomena and/or chemical phenomena may be observed at high sensitivity and high definition.

Those skilled in the art will appreciate that various adaptations and modifications of the described preferred embodiments can be configured without departing from the scope and spirit of the invention. Therefore, it is to be understood that, within the scope of the appended claims, the invention may be practiced other than as specifically described herein.

What is claimed is:

1. A detector assembly for detecting a plurality of different properties in a sample, comprising:
   a semiconductor substrate;
   a first detector unit on the substrate for measuring a first property of the sample; and
   a second detector unit on the substrate for measuring a second property of the sample, each of the first detector unit and second detector unit share a common sensor element and provide electrical charge output signals representative of respectively the first property and the second property.

2. The detector assembly of claim 1, wherein the common element is a sensor member that is responsive to light and to hydrogen ion.

3. The detector assembly of claim 2, wherein the sensor member is a silicon nitride film.

4. The detector assembly of claim 2, wherein the sensor member is a photo diode with an upper surface forming a light sensitive detector.

5. The detector assembly of claim 1, wherein the common element is a sensor member that is responsive to pressure and temperature.

6. The detector assembly of claim 5, wherein the sensor member is a combination diaphragm and pyroelectric element.

7. The detector assembly of claim 6 further including a second sensor member that is responsive to light.

8. The detector assembly of claim 1, wherein the first and second detector units are aligned in one direction on the substrate.

9. The detector assembly of claim 1, wherein a plurality of detector units in addition to the first and second detector units are on the substrate and are aligned in two directions on the substrate.

10. The detector assembly of claim 1, wherein the semiconductor substrate includes an n-type monocrystalline silicon layer, an $SiO_2$ insulator layer and a silicon base.

11. The detector assembly of claim 1, wherein an n-type monocrystalline silicon layer and an $SiO_2$ insulator layer form a diaphragm that bridges across separate portions of a silicon base to provide a pressure sensitive structure as the common element.

12. The detector of claim 11, wherein a pyroelectric element is mounted on the diaphragm.

13. The detector assembly of claim 1 further including a common output terminal connected to the first detector unit and the second detector unit to provide the electric output signal.

14. The detector assembly of claim 13, wherein the semiconductor substrate is a silicon on insulator substrate of a silicon base, a $SiO_2$ insulator layer over the silicon base and an n-type monocrystalline silicon substrate with a plurality of p-type regions.

15. The detector assembly of claim 1, wherein the substrate is a p-type silicon substrate with a plurality of n-type diffusion regions and the common element is separated from a pair of adjacent n-type diffusion regions by an insulating oxide film.

16. A detector assembly for measuring pressure and temperature comprising:
    a semiconductor substrate;
    a diaphragm member extending over an etched portion of the substrate;
    a pyroelectric element mounted on the diaphragm;
    means for measuring a change in pressure applied to the diaphragm, including a plurality of transistors formed on the semiconductor substrate; and
    means for measuring temperature, including the pyroelectric element mounted on the diaphragm.

17. The detector assembly of claim 16 further including means for measuring light, including a portion of the substrate forming a photo diode.

18. The detector assembly of claim 16, wherein the semiconductor substrate is silicon, and an n-type monocrystalline silicon layer and an $SiO_2$ insulator form a diaphragm that bridges across separate portions of a silicon base to provide a pressure sensitive structure.

19. The detector assembly of claim 18, wherein a gate element for the plurality of transistors is formed on the diaphragm and below the pyroelectric element.

20. A detector assembly for detecting a plurality of different properties of a specimen, comprising:
    a semiconductor substrate,
    a first detector unit on the substrate for measuring light intensity including a sensing unit to detect light;
    a second detector unit on the substrate for measuring an ion concentration operatively connected to the sensing unit to detect ion concentration;
    a first diffusion region in the substrate adjacent the sensing unit to function as an input diode;
    means for applying a voltage to the first diffusion region;
    a second diffusion region in the substrate adjacent the sensing unit to collect a charge from the sensing unit; and
    means for removing a charge from the second diffusion region as an output signal wherein the means for applying a voltage can enable an output signal from the sensing unit to represent measurements of respectively light and ion concentration from a common sensing element.

21. The detector assembly of claim 20 wherein the sensing unit is coated with silicon nitride.

22. A detector assembly for detecting light, pressure and temperature, comprising:
    a unitary semiconductor substrate;
    a first portion of the substrate formed into a diaphragm;
    a pressure detector unit including a plurality of channel transistors provided on the diaphragm to detect pressure on the basis of a change in channel conductance of the channel transistors when pressure is applied to the diaphragm;
    a pyroelectric detector unit positioned above the diaphragm wherein the channel transistors and an output of the channel transistors provides a measurement of temperature; and
    a photo diode unit positioned on the substrate to measure light.

23. The detector assembly of claim 22 wherein a single output terminal provides signals of pressure and temperature.

24. The detector assembly of claim 1 further including means for transferring output signals including a charge coupled device.

25. The detector assembly of claim 24 wherein the means for transferring output signals provides a sequential time series of signals.

26. The detector assembly of claim 25 wherein the first detector unit detects light intensity.

* * * * *